United States Patent
Park

(10) Patent No.: US 9,780,767 B2
(45) Date of Patent: Oct. 3, 2017

(54) CLOCK GENERATING CIRCUIT AND SEMICONDUCTOR APPARATUS INCLUDING THE SAME

(71) Applicant: SK hynix Inc., Icheon-si Gyeonggi-do (KR)

(72) Inventor: Myeong Jae Park, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/152,708

(22) Filed: May 12, 2016

(65) Prior Publication Data

US 2017/0230039 A1 Aug. 10, 2017

(30) Foreign Application Priority Data

Feb. 5, 2016 (KR) .................. 10-2016-0014739

(51) Int. Cl.
*H03K 3/00* (2006.01)
*H03K 5/15* (2006.01)

(52) U.S. Cl.
CPC .................. *H03K 5/1506* (2013.01)

(58) Field of Classification Search
CPC .................................................. H03K 5/1506
See application file for complete search history.

(56) References Cited

U.S. PATENT DOCUMENTS

| | | | |
|---|---|---|---|
| 7,450,925 B2 | 11/2008 | Chae et al. | |
| 7,535,272 B1* | 5/2009 | Kwong | H03L 7/081 |
| | | | 327/156 |
| 8,982,939 B2 | 3/2015 | Song | |
| 2011/0194659 A1* | 8/2011 | Kenney | H03L 7/0807 |
| | | | 375/355 |

OTHER PUBLICATIONS

Hamid Partovi et al., "Data Recovery and Retiming for the Fully Buffered DIMM 4.8Gb/s Serial Links," 2006 IEEE International Solid-State Circuits Conference, Feb. 7, 2006, pp. 1-10, IEEE.

* cited by examiner

*Primary Examiner* — Daniel Puentes
(74) *Attorney, Agent, or Firm* — William Park & Associates Ltd.

(57) ABSTRACT

A clock generation circuit may include a first clock generator, a second clock generator, and a common mode generator. The first clock generator may generate a multi-phase clock signal from a first clock signal. The second clock generator may generate a multi-phase clock signal from a second clock signal. The common mode generator may generate a reference voltage based on the first and second clock signals.

20 Claims, 3 Drawing Sheets

CLOCK GENERATING CIRCUIT AND SEMICONDUCTOR APPARATUS INCLUDING THE SAME

CROSS-REFERENCES TO RELATED APPLICATION

The present application claims priority under 35 U.S.C. §119(a) to Korean application number 10-2016-0014739 filed on Feb. 5, 2016 in the Korean Intellectual Property Office, which is incorporated herein by reference in its entirety.

BACKGROUND

1. Technical Field

Various embodiments generally relate to a semiconductor apparatus, and more particularly to a clock generation circuit capable of generating a clock signal and a semiconductor apparatus having the same.

2. Related Art

A semiconductor system may include a plurality of semiconductor apparatuses. When an interface circuit for data communication exchanges data between the semiconductor apparatuses, a clock signal may be used to synchronize data communications.

To increase operation speed, a sub-rate multi-phase clock signal may be used instead of a full-rate clock signal, and a phase locked loop (PLL) or a delay locked loop (DLL) may be used to generate a multi-phase clock signal having a predetermined phase difference from a system clock signal or a reference clock signal. However, due to the complexity of circuit, the phase locked loop and the delay locked loop may occupy a large space. In addition, they may consume a large amount of power and need a locking time.

SUMMARY

In an embodiment, a clock generation circuit may include a first clock generator, a second clock generator, and a common mode generator. The first clock generator may receive a first clock signal through a first input node and output first and second output clock signals. The second clock generator may receive a second clock signal, which has a phase lagging behind the first clocks signal by 180 degrees, through a second input node and output third and fourth output clock signals. The common mode generator coupled between the first input node and the second input node may provide a reference voltage to the first and second clock generators.

In an embodiment, a clock generation circuit may include a first multi-phase clock generator, a second multi-phase clock generator, a third multi-phase clock generator, a fourth multi-phase clock generator, and a common mode generator. The first multi-phase clock generator may be coupled to a first input node through which a first clock is provided, and may generate a first output clock signal. The second multi-phase clock generator may be coupled between the first input node and a common node, and may generate a second output clock signal. The third multi-phase clock generator may be coupled to a second input node through which a second clock signal is provided, and may generate a third output clock signal. The fourth multi-phase clock generator may be coupled between the second input node and the common node, and may generate a fourth output clock signal. The common mode generator may be coupled between the first input node and the second input node, and may provide the common node with a reference voltage.

A semiconductor apparatus may include a clock generation circuit and a data sampler. The clock generation circuit may include first and second clock generators and a common mode generator. The first clock generator may receive a first clock signal through a first input node and output first and second output clock signals. The second clock generator may receive a second clock signal, which has a phase lagging behind the first clocks signal by 180 degrees, through a second input node and output third and fourth output clock signals. The common mode generator may be coupled between the first input node and the second input node and provide a reference voltage to the first and second clock generators. The data sampler may receive data signals in synchronization with the first to fourth output clock signals generated by the clock generation circuit. The semiconductor apparatus may further include a deserializer generating internal data signals in response to output signals of the data sampler. The semiconductor apparatus may further include a filter detecting whether the data signals have been precisely sampled by the data sampler. The semiconductor apparatus may further include a delaying circuit adjusting an amount of delay of the first to fourth output clock signals in response to an early/late signal generated by the filter according to the phase of the first to fourth output clock sign.

DETAILED DESCRIPTION

Hereinafter, a semiconductor apparatus according to various embodiments of the present invention will be described below with reference to the accompanying drawings.

Figure 1:
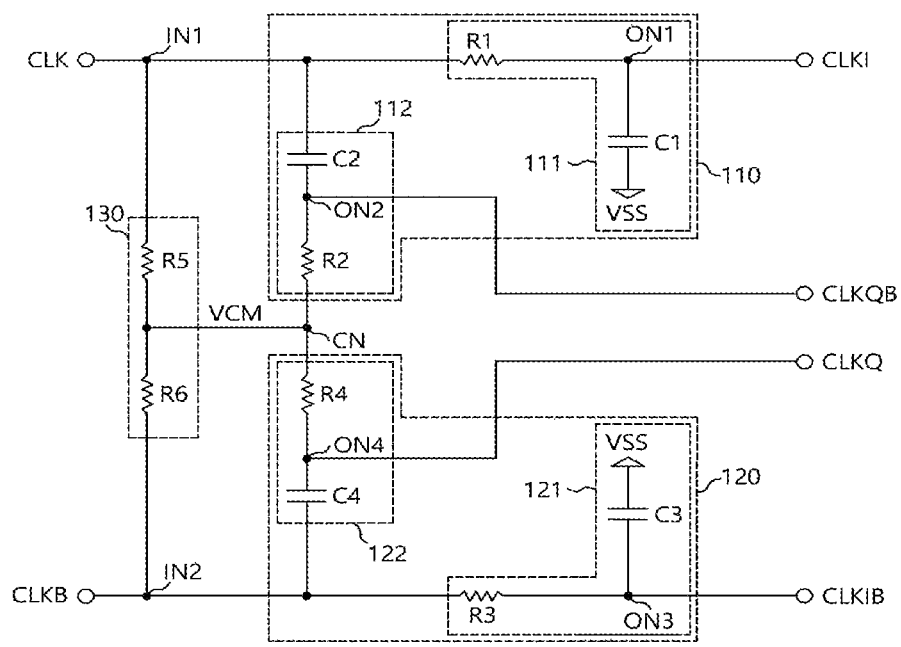
FIG. 1 is a diagram illustrating an example of a clock signal generation circuit in accordance with an embodiment.

FIG. 1 is a diagram illustrating an example of a clock signal generation circuit 100 in accordance with an embodiment. The clock signal generation circuit 100 may receive a first clock signal CLK and a second clock signal CLKB. The clock signal generation circuit 100 may receive the first clock signal CLK at a first input node IN1, and may receive the second clock signal CLKB at a second input node IN2. The first clock signal CLK may have phase difference of 180° with respect to the second clock signal CLKB. The second clock signal CLKB may be a differential clock signal of the first clock signal CLK. The clock signal generation circuit 100 may generate a plurality of multi-phase clock signals having different phases in response to the first and second clock signals CLK and CLKB.

Referring to FIG. 1, the clock signal generation circuit 100 may include a first clock generator 110, a second clock generator 120, and a common mode generator 130. The first clock generator 110 may receive the first clock signal CLK at the first input node IN1, and generate a first output clock signal CLKI and a second output clock signal CLKQB. The first clock generator 110 may generate the first and second output clock signals CLKI and CLKQB by phase-delaying the first clock signal CLK. The first output clock signal CLKI may have a different phase from the second output clock signal CLKQB. For example, the first clock generator 110 may generate the first output clock signal CLKI by delaying the first clock signal CLK by a first amount of time and generate the second output clock signal CLKQB by delaying the first clock signal CLK by a second amount of time.

The second clock generator 120 may receive the second clock signal CLKB at the second input node IN2 and generate a third output clock signal CLKIB and a fourth output clock signal CLKQ. The second clock generator 120 may generate the third and fourth output clock signals CLKIB and CLKQ by phase-delaying the second clock signal CLKB. The third output clock signal CLKIB may have a different phase from the fourth output clock signal CLKQ. For example, the second clock generator 120 may generate the third output clock signal CLKIB by delaying the second clock signal CLKB by the first amount of time and generate the fourth output clock signal CLKQ by delaying the second clock signal CLKB by the second amount of time.

The common mode generator 130 may be coupled between the first and second nodes IN1 and IN2, and may generate a reference voltage VCM. The reference voltage VCM may have an average voltage level of high and low levels of the first and second clock signals CLK and CLKB. For example, when the high level of the first and second clock signals CLK and CLKB is 1 V and the low level of the first and second clock signals CLK and CLKB is a ground level, the reference voltage VCM may have the voltage level of ½ V. Since the first clock signal CLK may have phase difference of 180 degrees with respect to the second clock signal CLKB, the common mode generator 130 may generate the reference voltage VCM having the average voltage level of high and low levels of the first and second clock signals CLK and CLKB. The common mode generator 130 may provide the reference voltage VCM to a common node CN, which is used as a virtual ground voltage node. In an embodiment, the common node CN may be coupled to the first clock generator 110 and the second clock generator 120, and thus the common mode generator 130 may provide the reference voltage VCM to the first clock generator 110 and the second clock generator 120.

Referring to FIG. 1, the first clock generator 110 may include a first multi-phase clock generator 111 and a second multi-phase clock generator 112. The first multi-phase clock generator 111 may generate the first output clock signal CLKI by delaying the first clock signal CLK by the first amount of time. The second multi-phase clock generator 112 may generate the second output clock signal CLKQB by delaying the first clock signal CLK by the second amount of time.

The first multi-phase clock generator 111 may include a first resistive element R1 and a first capacitive element C1. The first resistive element R1 may be coupled between the first input node IN1 and a first output node ON1. The capacitive element C1 may be coupled between the first output node ON1 and a ground voltage node VSS. The first output clock signal CLKI may be output through the first output node ON1. The second multi-phase clock generator 112 may include a second resistive element R2 and a second capacitive element C2. The second capacitive element C2 may be coupled between the first input node IN1 and a second output node ON2. The second resistive element R2 may be coupled between the second output node ON2 and the common mode generator 130. The second output clock signal CLKI may be output through the second output node ON2. The second resistive element R2 may be coupled between the second output node ON2 and the common node CN. The second resistive element R2 may have the same or substantially the same resistance value as the first resistive element R1. The second capacitive element C2 may have the same or substantially the same capacitance value as the first capacitive element C1.

Using Laplace transform, the phase of the first output clock signal CLKI may be determined by the following equation 1.

$$\frac{\left(\frac{1}{SC1}\right)}{\left(R1 + \left(\frac{1}{SC1}\right)\right)} \quad \text{[Equation 1]}$$

Also, the phase of the second output clock signal CLKQB may be determined by the following equation 2.

$$\frac{R2}{\left(R2 + \left(\frac{1}{SC2}\right)\right)} \quad \text{[Equation 2]}$$

In equations 1 and 2 the denotation "S" may represent a frequency of the first clock signal CLK.

Equation 1 may have a phase value of minus 90 degrees, and equation 2 may have a phase value of zero degree. Therefore, the second output clock signal CLKQB may have a phase lagging behind the first output clock signal CLKI by 90 degrees. Accordingly, the first amount of time may correspond to the phase value of 270 degrees of the first clock signal CLK, and the second amount of time may correspond to the phase value of 360 degrees of the first clock signal CLK.

The second clock generator 120 may include a third multi-phase clock generator 121 and a fourth multi-phase clock generator 122. The third multi-phase clock generator 121 may generate the third output clock signal CLKIB by delaying the second clock signal CLKB by the first amount of time. The fourth multi-phase clock generator 122 may generate the fourth output clock signal CLKQ by delaying the second clock signal CLKB by the second amount of time.

The third multi-phase clock generator 121 may include a third resistive element R3 and a third capacitive element C3. The third resistive element R3 may be coupled between the second input node IN2 and a third output node ON3. The capacitive element C1 may be coupled between the third output node ON3 and a ground voltage node VSS. The third output clock signal CLKIB may be output through the third output node ON3. The fourth multi-phase clock generator 122 may include a fourth resistive element R4 and a fourth capacitive element C4. The fourth capacitive element C4 may be coupled between the second input node IN2 and a fourth output node ON4. The fourth resistive element R4 may be coupled between the fourth output node ON4 and the common mode generator 130. The fourth output clock signal CLKI may be output through the fourth output node ON4. The fourth resistive element R4 may be coupled between the second output node ON2 and the common node CN. The fourth resistive element R4 may have the same or substantially the same resistance value as the first to third resistive elements R1 to R3. The fourth capacitive element C4 may have the same or substantially the same capacitance value as the first to third capacitive elements C1 to C3.

Like the first multi-phase clock generator 111, the third multi-phase clock generator 121 may generate the third output clock signal CLKIB having a phase lagging behind the second clock signal CLKB by 270 degrees. Like the second multi-phase clock generator 112, the fourth multi-phase clock generator 122 may generate the fourth output clock signal CLKQ having a phase lagging behind the second clock signal CLKB by 360 degrees. Since the second clock signal CLKB has a phase lagging behind the first clock signal CLK by 180 degrees, the first output clock signal CLKI may have a phase leading the third output clock signal CLKIB by 90 degrees, and the third output clock signal CLKIB may have a phase leading the fourth output clock signal CLKQ by 90 degrees, and the fourth output clock signal CLKQ may have a phase leading the second output clock signal CLKQB by 90 degrees. With reference to the first output clock signal CLKI, the second output clock signal CLKQB may have a 270-degree lagging phase, and the third output clock signal CLKIB may have a 180-degree lagging phase, and the fourth output clock signal CLKQ may have a 90-degree lagging phase. Therefore, the clock signal generation circuit 100 may generate four multi-phase clock signals having phase difference of 90 degrees.

Referring to FIG. 1, the common mode generator 130 may include a fifth resistive element R5 and a sixth resistive element R6. The fifth resistive element R5 may be coupled between the first input node IN1 and the common node CN. The sixth resistive element R6 may be coupled between the second input node IN2 and the common node CN. The sixth resistive element R6 may have the same or substantially the same resistance value as the fifth resistive element R5. The fifth resistive element R5 may change voltage level of the common node CN according to the first clock signal CLK. The sixth resistive element R6 may change the voltage level of the common node CN according to the second clock signal CLKB. Since the first clock signal CLK and the second clock signal CLKB have the phase difference of 180 degrees, the voltage level of the common node CN or the level of the reference voltage VCM may be kept substantially consistent. The reference voltage VCM may have the average voltage level of high and low levels of the first and second clock signals CLK and CLKB. The common mode generator 130 may not need additional power from outside since the common mode generator 130 generates the reference voltage VCM through the first and second clock signals CLK and CLKB.

Figure 2:
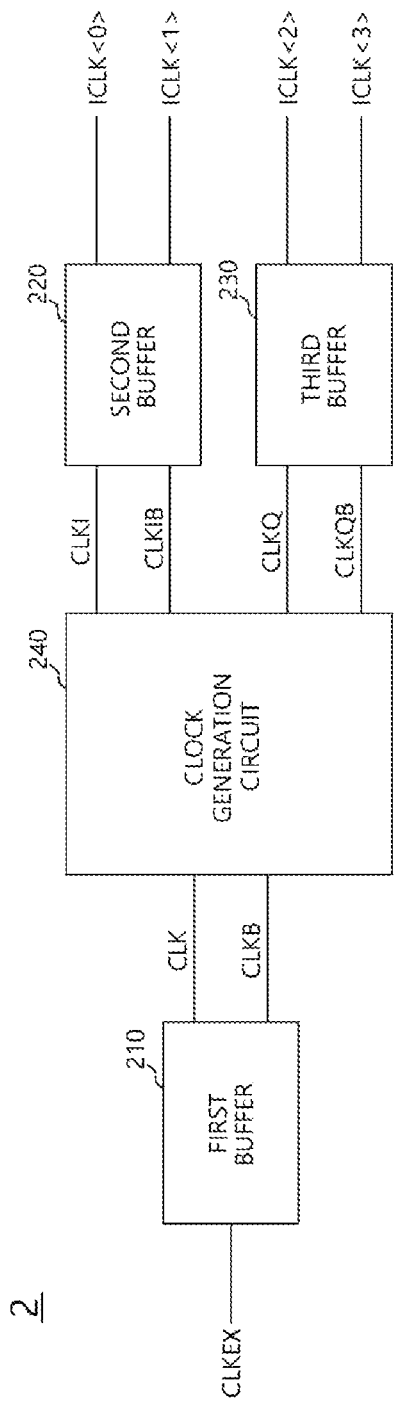
FIG. 2 is a diagram illustrating an example of an interface circuit in accordance with an embodiment.

FIG. 2 is a diagram illustrating an example of an interface circuit 2 in accordance with an embodiment of the present disclosure. Referring to FIG. 2, the interface circuit 2 may include a plurality of buffers and a clock generation circuit. For example, the interface circuit 2 may include a first buffer 210, a second buffer 220, a third buffer 230, and a clock generation circuit 240. The clock generation circuit 240 may be the same as the clock signal generation circuit 100 of FIG. 1. The first buffer 210 may buffer a source clock CLKEX and generate the first and second clock signals CLK and CLKB. In an embodiment, the source clock CLKEX may be provided through a bus from an external device coupled to a semiconductor apparatus including the interface circuit 2. In an embodiment, the source clock CLKEX may be generated from a phase locked loop. In an embodiment, the source clock CLKEX may be generated from a phase locked loop and divided by a clock tree.

The clock generation circuit 240 may generate the first to fourth output clock signals CLKI, CLKQB, CLKIB and CLKQ based on the first and second clock signals CLK and CLKB. The second buffer 220 may buffer the first output clock signal CLKI and the third output clock signal CLKIB and output first and second internal clock signals ICLK<0> and ICLK<1>Since the third output clock signal CLKIB has a phase lagging behind the first output clock signal CLKI by 180 degrees, the second internal clock signal ICLK<1> may have a phase lagging behind the first internal clock signal ICLK<0> by 180 degrees. The third buffer 230 may buffer the second output clock signal CLKQB and the fourth output clock signal CLKQ and output third and fourth internal clock signals ICLK<2> and ICLK<3>Since the second output clock signal CLKQB has a phase lagging behind the fourth output clock signal CLKQ by 180 degrees, the fourth internal clock signal ICLK<3> may have a phase lagging behind the third internal clock signal ICLK<2> by 180 degrees. The first to fourth internal clock signals ICLK<0:3> may have 90-degree phase increments/decrements. The first to fourth internal clock signals ICLK<0:3> may be provided to the semiconductor apparatus including the interface circuit 2 for the internal circuits therein.

Figure 3:
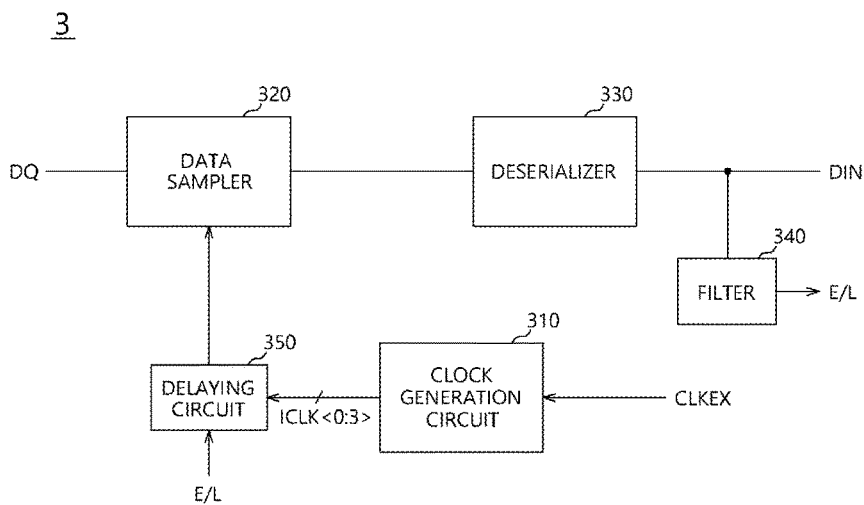
FIG. 3 is a diagram illustrating an example of a semiconductor apparatus in accordance with an embodiment.

FIG. 3 is a diagram illustrating the semiconductor apparatus 3 in accordance with an embodiment of the present invention. Referring to FIG. 3, the semiconductor apparatus 3 may include a clock generation circuit 310, a data sampler 320, a deserializer 330, a filter 340, and a delaying circuit 350. The clock generation circuit 310 may be the same as the clock generation circuit 100 of FIG. 1. Also, the clock generation circuit 310 may include a plurality of buffers such as the interface circuit 2 described with reference to FIG. 2.

The data sampler 320 may receive data DQ in synchronization with multi-phase clock signals generated from the clock generation circuit 310. The data DQ may be provided through a bus from an external device coupled to the semiconductor apparatus 3. For example, a serial communication interface may be used in providing the data DQ through the bus. If the data DQ include first to fourth input data signals, which are serially input, the data sampler 320 may sample the first input data signal in synchronization with the first internal clock signal ICLK<0>the second input data signal in synchronization with the second internal clock signal ICLK<1>the third input data signal in synchronization with the third internal clock signal ICLK<2>and the fourth input data signal in synchronization with the fourth internal clock signal ICLK<3>.

The deserializer 330 may receive the output of the data sampler 320, and then may generate internal data DIN from the output of the data sampler 320. For example, a parallel communication interface may be used in providing the internal data DIN. In an embodiment, the deserializer 330 may generate the internal data DIN by transforming the data DQ input using a serial communication into the internal data DIN output using a parallel communication. The filter 340 may receive the internal data DIN and detect whether the data DQ have been precisely sampled by the data sampler 320. Since the data sampler 320 samples the data DQ in synchronization with the internal clock signal ICLK<0:3>the filter 340 may detect the phase lag and the phase lead of the internal clock signal ICLK<0:3> by detecting a logic level of the internal data DIN. The filter 340 may generate an early/late signal E/L according to the phase of the internal clock signal ICLK<0:3>.

The delaying circuit 350 may adjust an amount of delay according to the early/late signal E/L. The delaying circuit 350 may adjust sampling timing of the data sampler 320 by variably adjusting the internal clock signal ICLK<0:3> generated from the clock generation circuit 310. In an embodiment, the delaying circuit 350 may be coupled to a node through which the internal clock signals ICLK<0:3> are output from the clock generation circuit 310. In an embodiment, the delaying circuit 350 may adjust the amount of delay according to a control signal provided by a training operation as well as the early-late signal E/L.

While certain embodiments have been described above, it will be understood to those skilled in the art that the embodiments described are by way of example only. Accordingly, the clock generating circuit and semiconductor apparatus including the same should not be limited based on the described embodiments. Rather, the clock generating circuit and semiconductor apparatus including the same described herein should only be limited in light of the claims that follow when taken in conjunction with the above description and accompanying drawings.

What is claimed is:

1. A clock generation circuit comprising:
   a first clock generator configured to receive a first clock signal through a first input node and to output first and second output clock signals;
   a second clock generator configured to receive a second clock signal, which has a phase lagging behind the first clocks signal by 180 degrees, through a second input node, and to output third and fourth output clock signals; and
   a common mode generator, to which the first clock signal and second clock signal are input, configured to generate a reference voltage and provide the reference voltage to the first and second clock generators.

2. The clock generation circuit of claim 1, wherein the first clock generator comprises:
   a first multi-phase clock generator configured to generate the first output clock signal by delaying the first clock signal by a first amount of time; and
   a second multi-phase clock generator configured to generate the second output clock signal by delaying the first clock signal CLK by a second amount of time.

3. The clock generation circuit of claim 2, wherein the first multi-phase clock generator comprises:
   a first resistive element coupled between the first input node and a first output node; and
   a capacitive element coupled between the first output node and a ground voltage node,
   wherein the first output clock signal is output through the first output node.

4. The clock generation circuit of claim 2, wherein the second multi-phase clock generator comprises:
   a second capacitive element coupled between the first input node and a second output node; and
   a second resistive element coupled between the second output node and the common mode generator,
   wherein the second output clock signal is output through the second output node.

5. The clock generation circuit of claim 1, wherein the second clock generator comprises:
   a third multi-phase clock generator configured to generate the third output clock signal by delaying the second clock signal by a first amount of time; and
   a fourth multi-phase clock generator configured to generate the fourth output clock signal by delaying the second clock signal by a second amount of time.

6. The clock generation circuit of claim 5, wherein the third multi-phase clock generator comprises:
   a third resistive element coupled between the second input node and a third output node; and
   a third capacitive element coupled between the third output node and a ground voltage node,
   wherein the third output clock signal is output through the third output node.

7. The clock generation circuit of claim 5, wherein the fourth multi-phase clock generator comprises:
   a fourth capacitive element coupled between the second input node and a fourth output node; and
   a fourth resistive element coupled between the fourth output node and the common mode generator,
   wherein the fourth output clock signal is output through the fourth output node.

8. The clock generation circuit of claim 1, wherein the common mode generator comprises:
   a fifth resistive element coupled between the first input node and a common node; and
   a sixth resistive element coupled between the second input node and the common node,
   wherein the common mode generator provides the reference voltage to the first and second clock generators through the common node.

9. The clock generation circuit of claim 8, wherein the first and second clock generators are coupled to the common node and receive the reference voltage through the common node.

10. A clock generation circuit comprising:
    a first multi-phase clock generator coupled to a first input node through which a first clock is provided, the first multi-phase clock generator generating a first output clock signal;
    a second multi-phase clock generator coupled between the first input node and a common node, the second multi-phase clock generator generating a second output clock signal;
    a third multi-phase clock generator coupled to a second input node through which a second clock signal is provided, the third multi-phase clock generator generating a third output clock signal;
    a fourth multi-phase clock generator coupled between the second input node and the common node, the fourth multi-phase clock generator generating a fourth output clock signal; and
    a common mode generator coupled between the first input node and the second input node, the common mode generator providing the common node with a reference voltage.

11. The clock generation circuit of claim 10, wherein the first and second clock signals have a phase difference of 180 degrees.

12. The clock generation circuit of claim 10, wherein the first multi-phase clock generator comprises:
    a first resistive element coupled between the first input node and a first output node; and
    a capacitive element coupled between the first output node and a ground voltage node,
    wherein the first output clock signal is output through the first output node.

13. The clock generation circuit of claim 10, wherein the second multi-phase clock generator comprises:
    a second capacitive element coupled between the first input node and a second output node; and
    a second resistive element coupled between the second output node and the common node,
    wherein the second output clock signal is output through the second output node.

14. The clock generation circuit of claim 10, wherein the third multi-phase clock generator comprises:
    a third resistive element coupled between the second input node and a third output node; and
    a third capacitive element coupled between the third output node and a ground voltage node, wherein the third output clock signal is output through the third output node.

15. The clock generation circuit of claim 10, wherein the fourth multi-phase clock generator comprises:
   a fourth capacitive element coupled between the second input node and a fourth output node; and
   a fourth resistive element coupled between the fourth output node and the common node,
   wherein the fourth output clock signal is output through the fourth output node.

16. The clock generation circuit of claim 10, wherein the common mode generator comprises:
   a fifth resistive element coupled between the first input node and a common node; and
   a sixth resistive element coupled between the second input node and the common node.

17. A semiconductor apparatus comprising:
   a clock generation circuit including first and second clock generators and a common mode generator, the first clock generator receiving a first clock signal through a first input node and outputting first and second output clock signals, the second clock generator receiving a second clock signal, which has a phase lagging behind the first clocks signal by 180 degrees, through a second input node and outputting third and fourth output clock signals, the common mode generator, to which the first clock signal and second clock signal are input, generating a reference voltage and providing the reference voltage to the first and second clock generators; and
   a data sampler configured to receive data signals in synchronization with the first to fourth output clock signals generated by the clock generation circuit.

18. The semiconductor apparatus of claim 17, further comprising a deserializer configured to generate internal data signals in response to output signals of the data sampler.

19. The semiconductor apparatus of claim 17, further comprising a filter configured to detect whether the data signals have been precisely sampled by the data sampler.

20. The semiconductor apparatus of claim 19, further comprising a delaying circuit configured to adjust an amount of delay of the first to fourth output clock signals in response to an early/late signal generated by the filter according to the phase of the first to fourth output clock signal.

* * * * *